United States Patent
Zverev et al.

(10) Patent No.: US 6,894,421 B2
(45) Date of Patent: May 17, 2005

(54) CIRCUIT CONFIGURATION AND, IN PARTICULAR, A SWITCH-MODE POWER SUPPLY

(75) Inventors: Ilia Zverev, München (DE); Michael Herfurth, Gilching (DE)

(73) Assignee: Infineon Technologies AG, Munich (DE)

( * ) Notice: Subject to any disclaimer, the term of this patent is extended or adjusted under 35 U.S.C. 154(b) by 158 days.

(21) Appl. No.: 10/200,636

(22) Filed: Jul. 22, 2002

(65) Prior Publication Data

US 2003/0016111 A1 Jan. 23, 2003

(30) Foreign Application Priority Data

Jul. 20, 2001 (DE) .......................................... 101 35 629

(51) Int. Cl.[7] .............................................. H01L 41/08
(52) U.S. Cl. .................................. 310/317; 310/316.01
(58) Field of Search .......................... 310/316.01, 317, 310/319, 359, 366

(56) References Cited

U.S. PATENT DOCUMENTS

| | | | | |
|---|---|---|---|---|
| 2,789,557 A | * | 4/1957 | Davis, Jr. ...................... 601/2 |
| 3,071,736 A | * | 1/1963 | Vonbun et al. ................ 331/69 |
| 3,240,963 A | * | 3/1966 | Sasaki .......................... 310/334 |
| 4,600,851 A | * | 7/1986 | Isayama et al. .............. 310/324 |
| 5,329,200 A | * | 7/1994 | Zaitsu .................... 310/316.01 |
| 5,705,879 A | * | 1/1998 | Abe et al. .................... 310/359 |
| 5,777,425 A | * | 7/1998 | Ino et al. ..................... 310/359 |
| 5,866,968 A | | 2/1999 | Mech |
| 5,969,954 A | | 10/1999 | Zaitsu |

\* cited by examiner

*Primary Examiner*—Mark Budd
(74) *Attorney, Agent, or Firm*—Laurence A. Greenberg; Werner H. Stemer; Ralph E. Locher

(57) ABSTRACT

A circuit configuration, in particular, a switch-mode power supply, includes a transformer device and at least one semiconductor component to provide a particularly space-saving configuration having little susceptibility to interference, and with as little stray inductance as possible. The transformer device is in the form of an electromechanical conversion device, in particular, a piezo-transformer or the like, with, in particular, at least one connection of the transformer device forming a substantially mechanically identical connection to a connection of at least one semiconductor component.

45 Claims, 2 Drawing Sheets

CIRCUIT CONFIGURATION AND, IN PARTICULAR, A SWITCH-MODE POWER SUPPLY

BACKGROUND OF THE INVENTION

1. Field of the Invention

The invention relates to a circuit configuration and, in particular, to a switch mode power supply or the like.

Transformer devices that interact with specific semiconductor components are used in many circuit configurations. In such a case, the transformer devices have at least one input electrode and one output electrode. The semiconductor components themselves have at least one first connecting region and one second connecting region. Certain circuit configurations provide for a semiconductor component to be electrically connected by at least one of the connecting regions to the input electrode and/or to the output electrode of the transformer device, to be precise without the interposition of any further components.

Such conventional circuit configurations have the problem that prior art transformer devices are based on the principle of electromagnetic energy conversion. In such a case, an input voltage signal, which is applied to the input electrode, is first of all converted to a magnetic field through a corresponding current flow. This takes place, for example, by current flowing in a primary coil of the transformer device. The magnetic field that is produced in the primary coil is then transmitted to a secondary region having a secondary coil through a magnetic coupling—for example, through a ferrite core or the like, in which secondary coil the magnetic induction in the primary coil induces an electrical voltage, which can then be tapped off at the output electrode. A corresponding transformation ratio is defined between the input voltage and the output voltage by the choice of the coil parameters, in particular, by the choice of the numbers of turns.

One problem in such a case is that the increase in voltage, that is to say, the transformer effect, is produced through the magnetic field transmission. The configuration of every circuit configuration, that is to say, in particular, as a result of the contact-making lines and board substrates, results in parasitic inductances or stray inductances. Any changes in the magnetic field, in particular, in the magnetic field in the region of the transformer device, automatically leads to induction voltages resulting from the stray inductances. Even in the case of rapid switching processes and, in particular, in the immediate vicinity, that is to say, even in the case of the semiconductor components that are connected directly to the transformer device, the induction voltages and the electric currents that are forced to flow as a result thereof assume a considerable magnitude such that the circuit regions in which these induction currents or induction voltages occur and, in particular, the corresponding semiconductor components, may subsequently have their characteristics changed or even damaged. Furthermore, the stray inductances have a disadvantageous effect on radio suppression.

Previous efforts to ameliorate the hazards resulting from induced voltages or currents have been directed at keeping the parasitic inductances or stray inductances as low as possible, especially in the region of those semiconductor components that make direct contact with the transformer device. On the other hand, certain protection circuits have been integrated in the circuit configurations, for example, in the form of so-called snubbers, but these increase the circuitry complexity and the area required for the circuit configuration.

2. Summary of the Invention

It is accordingly an object of the invention to provide a circuit configuration and, in particular, a switch-mode power supply, that overcomes the hereinafore-mentioned disadvantages of the heretofore-known devices of this general type and that allow operation of semiconductor components, which are connected to a transformer device, in a particularly protected manner.

With the foregoing and other objects in view, there is provided, in accordance with the invention, a circuit configuration, including an electromechanical conversion transformer having at least one input electrode and at least one output electrode, at least one semiconductor component having at least one first connecting region and at least one second connecting region, and the semiconductor component directly mechanically and electrically connected by at least one of the first connecting region and second connecting region to at least one of the input electrode and the output electrode.

In accordance with another feature of the invention, the semiconductor component has at least one connecting region and the transformer has at least one connecting region substantially mechanically identical to the connecting region of the semiconductor component.

The circuit configuration according to the invention and, in particular, the switch-mode power supply according to the invention are characterized in that the transformer device is in the form of an electromechanical conversion device.

One basic idea of the present invention is, thus, to reduce or to avoid the influence of any stray inductances or parasitic inductances that may be present by dispensing with the activity of the transformer device to transmit a magnetic field. The lack of such a transmitting magnetic field also means that the parasitic inductances or stray inductances are not critical because induced voltages or currents also may largely disappear when there are no alternating magnetic fields. The fundamental principle in this case is that electromechanical coupling in the transformer device produces the conversion effect.

In such a case, in accordance with a further feature of the invention, it is particularly advantageous for the transformer device to be in the form of a piezo-transformer or the like. Such a piezo-transformer makes use of the so-called piezoelectric effect in a corresponding material. The input voltage is supplied through the input electrode to the material that is provided for the electromechanical conversion. The electric field that is formed in the material that is provided for the electromechanical conversion changes the geometric structure of this material in accordance with the piezoelectric effect. This geometric change may be detectable externally as a mechanical or micromechanical movement. On the other hand, in accordance with the piezoelectric effect, any mechanical movement of the material that is provided for the electromechanical conversion results in a corresponding change in the electrical field strength distribution. Consequently, a correspondingly transformed output voltage can be tapped off at an output electrode at some other point on the material that is provided for the conversion process. If the input electrode and the output electrode are disposed at different positions on the material that is provided for the conversion process, then the input voltage and the output voltage arc normally also different to one another.

In addition to avoiding or reducing the risk caused by induction voltages that are transmitted through the parasitic inductances, the use of an electromechanical conversion device also results in the advantage that the components of the circuit configuration and, in particular, the semiconductor components that are provided and are intended to make direct contact with the transformer device can be fitted physically more closely to the transformer device because the respective transformer device now no longer produces any stray magnetic fields.

Thus, In accordance with an added feature of the invention, it is possible to produce, in particular, the switch-mode power supply with a more compact construction. It is particularly advantageous for the semiconductor component to be formed in each case with at least one connecting region that is connected substantially directly mechanically and/or electrically to the input electrode and/or to the output electrode. This means that the first and/or second connecting region of each semiconductor component can be fitted directly to the input electrode or to the output electrode, without the interposition of a line device.

In accordance with an additional feature of the invention, the substantially direct mechanical and/or electrical connection is advantageously respectively formed by a solder region, an adhesive region, and/or the like.

In accordance with yet another feature of the invention, the configuration and the structure of the substantially direct mechanical and/or electrical connection between the input electrode/output electrode of the transformer device and the respective connecting region of the semiconductor component are particularly simple if the input electrode, the output electrode, the first connecting region, and/or the second connecting region are each substantially flat and/or planar, and/or have/has a respective flat and/or planar element for making contact.

In accordance with yet a further feature of the invention, materials such as silver, copper, compounds of silver and copper and/or similar materials and/or materials that contain silver, copper, compounds of silver and copper and/or the like are preferred to form the input electrode, the output electrode, the first connecting region, and/or the second connecting region.

In accordance with yet an added feature of the invention, a piezoelectric ceramic or the like is preferably used as the material for the electromechanical conversion.

In accordance with yet an additional feature of the invention, to carry out the transformation process, the invention provides that the transformer device and, in particular, the material for the electromechanical conversion thereof have a longitudinal extent and at least a transverse extent that are matched to a desired or intended transformation ratio of the transformer device.

In accordance with again another feature of the invention, for variation of the desired transformation ratio, the transformer device and, in particular, the material for the electromechanical conversion by the transformer device are substantially in the form of a cuboid, a cylinder, and/or the like.

In accordance with again a further feature of the invention, the semiconductor component is in the form of a diode, a switching device, a transistor device, and/or the like. An appropriate number of semiconductor components of the type just mentioned may be provided, if necessary, also in mixed form.

In accordance with a concomitant feature of the invention, there is provided a cooling element is provided on the input electrode and/or on the output electrode of the transformer device together with a respective connecting region of the semiconductor component, in particular, for cooling of the semiconductor component and/or of the transformer device.

Those aspects of the present invention that have been described above, as well as further aspects of the present invention, will be explained in more detail in the following description.

Magnetic components, such as transformers and inductors, are important components of pulsed switch-mode power supplies. Semiconductor components that are connected to magnetic components such as these, for example, switches or diodes or the like, should be positioned or provided in the immediate vicinity of these magnetic components to keep the unavoidable parasitic inductances as low as possible. These parasitic inductances or stray inductances are produced, for example, by wires, PCB conductor tracks, or by transformer windings or the like. Parasitic inductances between the transformer or the transformer device and the power semiconductors can lead to overvoltages, which are dangerous to the semiconductor, in the sense of induction voltages, in which case the induction voltage $U_L$ resulting from the parasitic or stray inductance L is associated with the rate of change of the current dI/dt in accordance with:

$$U_L = -L\, dI/dt.$$

Such overvoltage $U_L$ can lead to a permanent change, damage, or destruction of the semiconductor, particularly, if its breakdown voltage is exceeded.

Such a problem of overvoltages resulting from induction through parasitic or stray inductances is a major aspect of the present invention.

Another aspect that the present invention is intended to deal with is the system miniaturization of circuit configurations with a transformer device and semiconductor components coupled thereto.

Nowadays, magnetic elements such as transformers or the like and semiconductor components are provided as separate components. This results in a large amount of space being consumed in the circuit configurations, for example, on a board or the like. The proposed solution allows magnetic elements and the semiconductors that make contact with them to be combined as a compact component group. Specifically, compaction is accomplished by fitting the corresponding semiconductor components directly to the electrodes or the transformer devices, which are in the form of electromechanical conversion devices.

Conventional procedures for suppressing overvoltages require complex circuitry and prevent such a compact layout. By way of example, protection circuits are provided, for example, so-called snubbers. Such circuit complexity requires space in the region of the circuit configuration, which is contrary to the objective of system miniaturization.

Parasitic inductances can also be kept low by an optimized layout, although this results in certain circuitry restrictions.

With regard not only to the layout question but also to the provision of additional protection circuits, it must be remembered that these involve additional costs, firstly from the construction of these modified circuit configurations and secondly from the additional power losses that occur in the protection circuits.

In contrast, the modern further development of conventional transformers as piezo-transformers offers a suitable starting point to avoid the disadvantages of the prior art. This new type of transformer is not based on any form of electromagnetic energy conversion, but on electromechanical energy conversion. The electrical signal that is applied to an input electrode produces a mechanical oscillation in the material for the conversion process, for example, a piezoelectric ceramic, based on the time profile of the input voltage to the input electrode, which can be tapped off from the output electrode to an electrical signal converted back in the opposite sense.

The new physical form of piezo-transformers allows greater system integration and miniaturization of semiconductor and transformer. Semiconductors can be fitted directly on the input electrode or on the output electrode of the piezo-transformer, where they can be adhesively bonded on, or soldered on, for example. In such a case, the electrical connection between the semiconductor component and the electrode of the piezo-transformer can be produced over a large area, using the lower face of the semiconductor. When using flip chip semiconductors, contact can also be made with the second face of the semiconductor. Such a configuration eliminates or reduces the parasitic inductance of the supply line.

In addition, if the electrodes of the piezo-transformer are constructed to be sufficiently large, it is also possible to fit heat sinks to the electrodes or to the electrode of the piezo transformer. Such a configuration, thus immediately allows better cooling of the transformer and, in particular, of the semiconductor component that is provided thereon.

Overall, the procedure according to the invention has the following advantages:
  elimination or reduction of parasitic inductances in the configuration of a transformer device and semiconductor component;
  elimination of protection circuits such as snubbers or the like;
  augmentation of the switching frequencies;
  expansion of the level of integration for further system miniaturization; and
  simplification of radio suppression.

In principle, virtually any topologies of circuit configurations and, in particular, of switch-mode power supplies may be used. In particular, any variants of flyback converters, forward converters, half bridges (half bridge converters), full bridges (bridge converters), Cuk converters, and the like may be used.

One fundamental aspect of the present invention is that semiconductor components are disposed directly on a piezo-transformer by soldering or adhesive bonding.

Other features that are considered as characteristic for the invention are set forth in the appended claims.

Although the invention is illustrated and described herein as embodied in a circuit configuration and, in particular, a switch-mode power supply, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
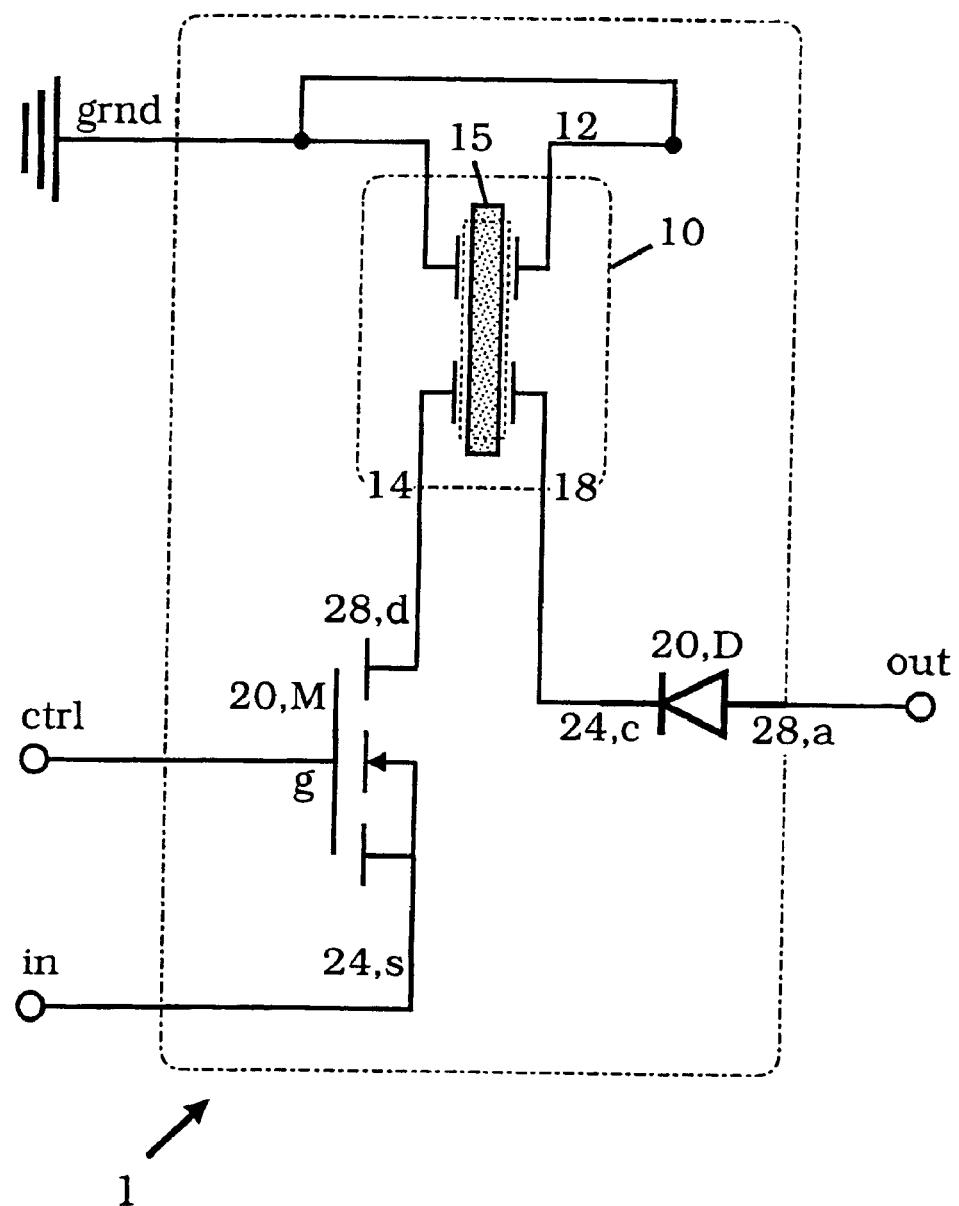
FIG. 1 is a schematic circuit diagram of the circuit configuration according to the invention.

Referring now to the figures of the drawings in detail and first, particularly to FIG. 1 thereof, there is shown, in schematic form, a circuit diagram for one embodiment of the circuit configuration 1 according to the invention. In the embodiment of FIG. 1, the circuit configuration 1 is in the form of a converter or the like.

An input connection can, in this case, be supplied with an input signal that, after conversion, can then be tapped off again as an output signal at an output connection out. The core element of the converter 1 is the transformer device 10, which is in the form of a piezo-transformer and uses a piezoelectric material 15. The power is supplied through an input electrode 14, and the power being emitted through an output electrode 18. Furthermore, an electrode 12 is provided that closes the circuit on the input side and the circuit on the output side and that is, by way of example, at ground potential.

The circuit configuration 1 according to the invention; in conjunction with the input electrode 14 and the output electrode 18, has a first semiconductor component in the form of a transistor M. The first connecting region 24 of the transistor M is formed by the source region s. The second connecting region 28 of the transistor M is in this case formed by the drain region d. A gate connecting region g is also provided. The second connecting region 28 or drain region d of the transistor M is mechanically and electrically connected directly to the input electrode 14 of the transformer device 10.

A diode device D is provided as the second semiconductor component 20. This has a cathode region c as the first connecting region 24, and an anode region a as the second connecting region 28. In the embodiment shown in FIG. 1, the first connecting region 24 or cathode region c of the diode D is mechanically and electrically connected directly to the output electrode 18 of the transformer device 10. The second connecting region 28 or anode region a of the diode D is connected to the output connection out of the circuit configuration.

Figure 2:
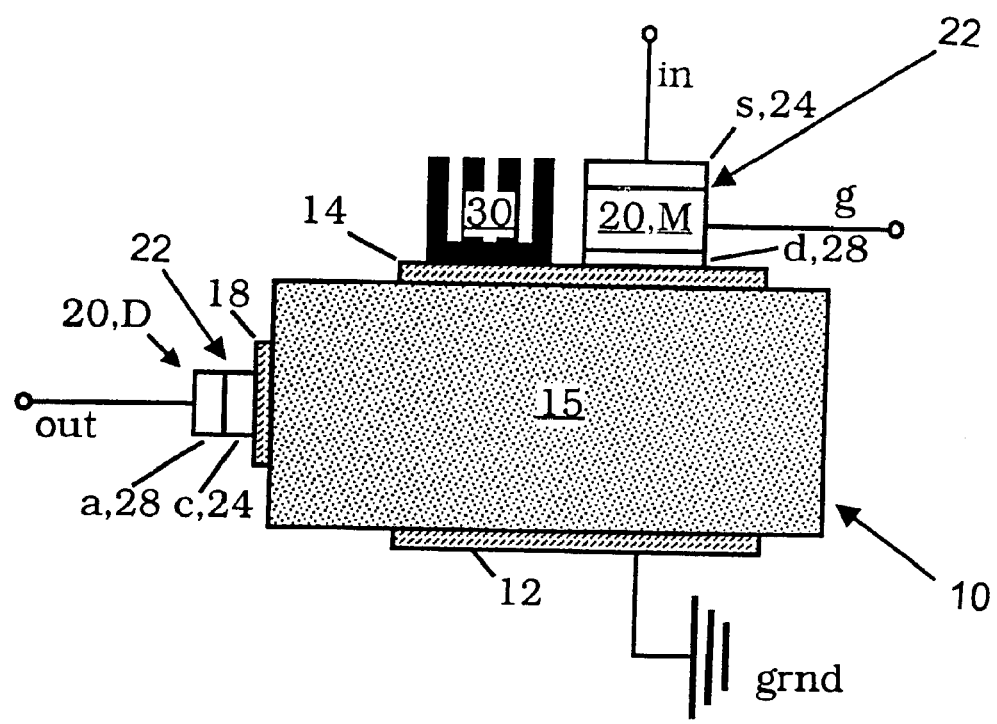
FIG. 2 is a partially schematic circuit diagram and partially cross-sectional view of an embodiment of the circuit configuration according to the invention.

FIG. 2 shows, in a schematic and partially sectioned side view, one possible embodiment of the circuit configuration 1 shown in FIG. 1, in which case corresponding reference symbols are intended to denote the same circuit elements.

The transformer device 10 is composed of a piezoelectric material 15, which substantially has a cuboid shape and has a specific longitudinal extent and a specific transverse extent. The input electrode 14 is formed along the longitudinal extent, and is opposite the ground electrode 12. The output electrode 18 is formed on the transverse extent.

The second connecting region 28 of the first semiconductor component 20, namely the drain region d of the transistor device M, is connected, and makes mechanical and electrical contact, directly with the input electrode 14. The input connection in the circuit configuration 1 is connected to the first connecting region 24, namely, to the source region s of the transistor device M. A substrate region 22 of the transistor device M is provided between the drain region d and the source region s and is driven through the gate connecting region g.

A first connecting region 24 of a diode device D, namely its cathode region c, is mechanically and electrically connected directly to the output electrode 18 of the transformer device 10. A substrate region 22 of the diode D is then followed by a second connecting region 28 or an anode region a of the diode D, which is connected to the output connection out of the circuit configuration 1.

During operation, an input signal is applied through the input connection in the circuit configuration 1 and is passed, when the transistor device M is switched on, to the input electrode 14, and produces a corresponding electric field there in the material region 15 that is intended for the conversion process. The electric field in the material region 15 results in a corresponding electric field being produced at the output electrode 18 and, hence, results in a corresponding electrical potential difference, which can be passed through the diode D to the output connection out of the circuit configuration 1, where is can be tapped off.

The large-area configuration of the input electrode 14 and of the output electrode 18 in the embodiment shown in FIG. 2 results in the capability to provide appropriate cooling devices 30 for the transistor M and for the diode D (i.e., heat sinks) so that heat can be extracted from the corresponding components M and D through the thermal coupling by the metallic electrodes 14 and 18.

We claim:

1. A circuit configuration, comprising:
   an electromechanical conversion transformer having:
      at least one input electrode; and
      at least one output electrode;
   at least one semiconductor component having:
      at least one first connecting region; and
      at least one second connecting region;
   said semiconductor component directly mechanically and electrically connected by at learnt one of said first connecting region and second connecting region to at least one of said input electrode and said output electrode; and
   a cooling element being disposed on at least one of said first connecting region and said second connecting region for cooling at least one of said semiconductor component and said transformer.

2. The circuit configuration according to claim 1, wherein:
   said semiconductor, component has at least one connecting region; and
   said transformer has at least one connecting region substantially mechanically identical to said connecting region of said semiconductor component.

3. The circuit configuration according to claim 1, wherein said transformer is a piezo-transformer.

4. The circuit configuration according to claim 1, wherein at least one of said direct mechanical connection and said direct electrical connection is one of the group consisting of a solder region and an adhesive region.

5. The circuit configuration according to claim 1, wherein at least one of said input electrode, said output electrode, said first connecting region, and said second connecting region is at least one of substantially flat and planar.

6. The circuit configuration according to claim 1, wherein at least one element selected from the group consisting of said input electrode, said output electrode, said first connecting region, and said second connecting region has at least one of a flat element and planar element.

7. The circuit configuration according to claim 1, wherein at least one of said input electrode, said output electrode, said first connecting region, and said second connecting region is formed from one of the group consisting of silver, copper, silver compounds, and copper compounds.

8. The circuit configuration according to claim 1, wherein at least one of said input electrode, said output electrode, said first connecting region, and said second connecting region has a material including one of the group consisting of silver, copper, silver compounds, and copper compounds.

9. The circuit configuration according to claim 1, wherein said transformer has a piezoelectric ceramic for electromechanical conversion.

10. The circuit configuration according to claim 1, wherein said transformer has:
    a transformation ratio; and
    a longitudinal extent and at least a transverse extent matched to said transformation ratio.

11. The circuit configuration according to claim 1, wherein:
    said transformer has a material for electromechanical conversion and a transformation ratio; and
    said material has a longitudinal extent and at least a transverse extent matched to said transformation ratio.

12. The circuit configuration according to claim 1, wherein said transformer is one of cuboid shaped and cylindrical.

13. The circuit configuration according to claim 1, wherein:
    said transformer has a material for electromechanical conversion; and
    said material is one of cuboid shaped and cylindrical.

14. The circuit configuration according to claim 1, wherein said semiconductor component is one of the group consisting of a diode, a switching element, and a transistor device.

15. A circuit configuration, comprising:
    an electromechanical conversion transformer having:
       at least one input electrode; and
       at least one output electrode;
    at least one semiconductor component having:
       at least one first connecting region; and
       at least one second connecting region;
    said semiconductor component directly mechanically and electrically connected by at least one of said first connecting region and second connecting region to at least one of said input electrode and said output electrode; and
    a cooling element disposed on at least one of said input electrode and said output electrode for cooling at least one of said semiconductor component and said transformer.

16. A circuit configuration, comprising:
    an electromechanical conversion transformer having:
       at least one input electrode; and
       at least one output electrode;
    at least one semiconductor component having:
       at least one first connecting region; and
       at least one second connecting region;
    said semiconductor component directly mechanically and electrically connected by at least one of said first connecting region and second connecting region to at least one of said input electrode and said output electrode; and
    a cooling element, said cooling element together with at least one of said first connecting region and said second connecting region being disposed on at least one of said input electrode and said output electrode for cooling at least one of said semiconductor component and said transformer.

17. A switch-mode power supply, comprising:
    an electromechanical conversion transformer having:

at least one input electrode; and
at least one output electrode;
at least one semiconductor component having:
at least one first connecting region; and
at least one second connecting region; and
said semiconductor component directly mechanically and electrically connected by at least one of said first connecting region and second connecting region to at least one of said input electrode and said output electrode at least one second connecting region;
said semiconductor component directly mechanically and electrically connected by at least one of said first connecting region and second connecting region to at least one of said input electrode and said output electrode; and
a cooling element, said cooling element one of:
being disposed on at least one of said first connecting region and said second connecting region for cooling at least one of said semiconductor component and said transformer;
being disposed on at least one of said input electrode and said output electrode for cooling at least one of said semiconductor component and said transformer; and
together with at least one of said first connecting region and said second connecting region, being disposed on at least one of said input electrode and said output electrode for cooling at least one of said semiconductor component and said transformer.

18. The circuit configuration according to claim 15, wherein:
said semiconductor component has at least one connecting region; and
said transformer has at least one connecting region substantially mechanically identical to said connecting region of said semiconductor component.

19. The circuit configuration according to claim 15, wherein said transformer is a piezo-transformer.

20. The circuit configuration according to claim 15, wherein at least one of said direct mechanical connection and said direct electrical connection is one of the group consisting of a solder region and an adhesive region.

21. The circuit configuration according to claim 15, wherein at least one of said input electrode, said output electrode, said first connecting region, and said second connecting region is at least one of substantially flat and planar.

22. The circuit configuration according to claim 15, wherein at least one element selected from the group consisting of said input electrode, said output electrode, said first connecting region, and said second connecting region has at least one of a flat element and planar element.

23. The circuit configuration according to claim 15, wherein at least one of said input electrode, said output electrode, said first connecting region, and said second connecting region is formed from one of the group consisting of silver, copper, silver compounds, and copper compounds.

24. The circuit configuration according to claim 15, wherein at least one of said input electrode, said output electrode, said first connecting region, and said second connecting region has a material including one of the group consisting of silver, copper, silver compounds, and copper compounds.

25. The circuit configuration according to claim 15, wherein said transformer has a piezoelectric ceramic for electromechanical conversion.

26. The circuit configuration according to claim 15, wherein said transformer has:
a transformation ratio; and
a longitudinal extent and at least a transverse extent matched to said transformation ratio.

27. The circuit configuration according to claim 15, wherein:
said transformer has a material for electromechanical conversion and a transformation ratio; and
said material has a longitudinal extent arid at least a transverse extent matched to said transformation ratio.

28. The circuit configuration according to claim 15, wherein said transformer is one of cuboid shaped and cylindrical.

29. The circuit configuration according to claim 15, wherein:
said transformer has a material for electromechanical conversion; and
said material is one of cuboid shaped and cylindrical.

30. The circuit configuration according to claim 15, wherein said semiconductor component is one of the group consisting of a diode, a switching element, and a transistor device.

31. The circuit configuration according to claim 15, including a cooling element disposed on at least one of said first connecting region and said second connecting region for cooling at least one of said semiconductor component and said transformer.

32. The circuit configuration according to claim 16, wherein:
said semiconductor component has at least one connecting region; and
said transformer has at least one connecting region substantially mechanically identical to said connecting region of said semiconductor component.

33. The circuit configuration according to claim 16, wherein said transformer is a piezo-transformer.

34. The circuit configuration according to claim 16, wherein at least one of said direct mechanical connection and said direct electrical connection is one of the group consisting of a solder region and an adhesive region.

35. The circuit configuration according to claim 16, wherein at least one of said input electrode, said output electrode, said first connecting region, and said second connecting region is at least one of substantially flat and planar.

36. The circuit configuration according to claim 16, wherein at least one element selected from the group consisting of said input electrode, said output electrode, said first connecting region, and said second connecting region has at least one of a flat element and planar element.

37. The circuit configuration according to claim 16, wherein at least one of said input electrode, said output electrode, said first connecting region, and said second connecting region is formed from one of the group consisting of silver, copper, silver compounds, and copper compounds.

38. The circuit configuration according to claim 16, wherein at least one of said input electrode, said output electrode, said first connecting region, and said second connecting region has a material including one of the group consisting of silver, copper, silver compounds, and copper compounds.

39. The circuit configuration according to claim 16, wherein said transformer has a piezoelectric ceramic for electromechanical conversion.

40. The circuit configuration according to claim 16, wherein said transformer has:
- a transformation ratio; and
- a longitudinal extent and at least a transverse extent matched to said transformation ratio.

41. The circuit configuration according to claim 16, wherein:
- said transformer has a material for electromechanical conversion and a transformation ratio; and
- said material has a longitudinal extent and at least a transverse extent matched to said transformation ratio.

42. The circuit configuration according to claim 16, wherein said transformer is one of cuboid shaped and cylindrical.

43. The circuit configuration according to claim 16, wherein:
- said transformer has a material for electromechanical conversion; and
- said material is one of cuboid shaped and cylindrical.

44. The circuit configuration according to claim 16, wherein said semiconductor component is one of the group consisting of a diode, a switching element, and a transistor device.

45. The circuit configuration according to claim 16, including a cooling element disposed on at least one of said first connecting region and said second connecting region for cooling at least one of said semiconductor component and said transformer.

* * * * *